United States Patent
Moriguchi

(10) Patent No.: US 9,837,251 B2
(45) Date of Patent: Dec. 5, 2017

(54) PLASMA ETCHING METHOD, PLASMA ETCHING DEVICE, PLASMA PROCESSING METHOD, AND PLASMA PROCESSING DEVICE

(71) Applicant: ULVAC, INC., Kanagawa (JP)

(72) Inventor: Naoki Moriguchi, Chigasaki (JP)

(73) Assignee: ULVAC, INC., Kanagawa (JP)

( * ) Notice: Subject to any disclaimer, the term of this patent is extended or adjusted under 35 U.S.C. 154(b) by 336 days.

(21) Appl. No.: 14/770,757

(22) PCT Filed: Feb. 25, 2015

(86) PCT No.: PCT/JP2015/055330
§ 371 (c)(1),
(2) Date: Aug. 26, 2015

(87) PCT Pub. No.: WO2015/129719
PCT Pub. Date: Sep. 3, 2015

(65) Prior Publication Data
US 2017/0169997 A1    Jun. 15, 2017

(30) Foreign Application Priority Data

Feb. 28, 2014 (JP) .................................. 2014-039049

(51) Int. Cl.
*H01J 37/32* (2006.01)
*H01L 21/3065* (2006.01)
(Continued)

(52) U.S. Cl.
CPC ........ *H01J 37/32697* (2013.01); *C03C 15/00* (2013.01); *H01J 37/32146* (2013.01);
(Continued)

(58) Field of Classification Search
CPC ........... H01J 37/32697; H01J 37/32146; H01J 37/32715; H01J 37/32706;
(Continued)

(56) References Cited

U.S. PATENT DOCUMENTS 5,378,311 A * 1/1995 Nagayama ........ H01J 37/32834
                                                    204/298.33
5,946,184 A * 8/1999 Kanno ................ H01L 21/6833
                                                    279/128

(Continued)

FOREIGN PATENT DOCUMENTS

JP    H04-51542 A    2/1992
JP    H 5-175180 A    7/1993
(Continued)

OTHER PUBLICATIONS

JPO English machine translation of JP 08-096989 A, Plasma treatment device and plasma treatment method, Nishizuka et al, Publication Date Apr. 12, 1996 (Year: 1996).*

(Continued)

*Primary Examiner* — Anita K Alanko
(74) *Attorney, Agent, or Firm* — Christensen, Fonder, Dardi & Herbert PLLC

(57) ABSTRACT

A plasma etching method includes a first step of attracting a substrate onto a monopolar electrostatic chuck in a first plasma, which is a plasma of a noble gas, and stopping generation of the first plasma after the attracting of the substrate, and a second step of etching the substrate in a second plasma, which is a plasma of a halogen-based etching gas, and stopping generation of the second plasma after the etching of the substrate. In the first step, the generation of the first plasma is stopped when a positive voltage is applied from the monopolar electrostatic chuck to the substrate. In the second step, the generation of the second plasma is stopped when a negative voltage is applied from the monopolar electrostatic chuck to the substrate.

13 Claims, 3 Drawing Sheets

(51) Int. Cl.
*H01L 21/67* (2006.01)
*H01L 21/683* (2006.01)
*C03C 15/00* (2006.01)
*C23C 16/50* (2006.01)
*C09K 13/00* (2006.01)
*H05F 3/00* (2006.01)
*H02N 13/00* (2006.01)

(52) U.S. Cl.
CPC .. *H01J 37/32165* (2013.01); *H01J 37/32706* (2013.01); *H01J 37/32715* (2013.01); *H01L 21/3065* (2013.01); *H01L 21/67069* (2013.01); *H01L 21/6831* (2013.01); *C09K 13/00* (2013.01); *C23C 16/50* (2013.01); *H01J 2237/04* (2013.01); *H01J 2237/334* (2013.01); *H02N 13/00* (2013.01); *H05F 3/00* (2013.01)

(58) Field of Classification Search
CPC ............ H01J 37/32165; H01J 2237/04; H01J 2237/334; H01L 21/3065; H01L 21/37069; H01L 21/6831; C03C 15/00; C23C 16/50; C09K 13/00; H05F 13/00; H02N 13/00
See application file for complete search history.

(56) References Cited

U.S. PATENT DOCUMENTS

| | | | | |
|---|---|---|---|---|
| 6,243,251 B1 * | 6/2001 | Kanno | ................ | H01L 21/6833 279/128 |
| 6,333,246 B1 * | 12/2001 | Narita | ................ | C23C 16/4401 257/E21.252 |
| 6,965,506 B2 * | 11/2005 | Howald | ............ | H01L 21/67242 361/234 |
| 7,615,132 B2 * | 11/2009 | Yasui | ................ | H01J 37/32082 118/723 E |
| 7,799,238 B2 * | 9/2010 | Shindo | ............. | H01J 37/32082 156/345.43 |
| 2005/0142873 A1 | 6/2005 | Shindo et al. | | |
| 2008/0242086 A1 | 10/2008 | Matsumaru et al. | | |
| 2012/0200981 A1 * | 8/2012 | Zhang | ................ | H01L 21/6833 361/212 |

FOREIGN PATENT DOCUMENTS

| | | |
|---|---|---|
| JP | H 8-96989 A | 4/1996 |
| JP | 2001-15581 A | 1/2001 |
| JP | 2001-176958 A | 6/2001 |
| JP | 2004-95909 A | 3/2004 |
| JP | 2005-051098 A | 2/2005 |
| JP | 2008-251676 A | 10/2008 |
| JP | 2012-169542 A | 9/2012 |
| KR | 100668956 B1 * | 1/2007 |

OTHER PUBLICATIONS

JPO English machine translation of JP 2012-169542 A, Plasma processing method, and plasma processing device, Moriguchi et al, Publication Date Sep. 6, 2012 (Year: 2012).*
Chinese Office Action of CN 201580000336.0 dated Dec. 3, 2015.
Korean Office Action of KR 10-2015-7022956 dated Dec. 3, 2015 with its English Translation.

* cited by examiner

PLASMA ETCHING METHOD, PLASMA ETCHING DEVICE, PLASMA PROCESSING METHOD, AND PLASMA PROCESSING DEVICE

RELATED APPLICATIONS

The present application is a National Phase entry of PCT Application No. PCT/JP2015/055330, filed Feb. 25, 2015, which claims priority from Japanese Patent Application No. 2014-039049, filed Feb. 28, 2014, the disclosures of which are hereby incorporated by reference herein in their entireties.

FIELD OF THE INVENTION

The technique of the present disclosure relates to a plasma etching method, a plasma etching device, a plasma processing method, and a plasma processing device that process a substrate attracted to a monopolar electrostatic chuck with plasma.

BACKGROUND OF THE INVENTION

A plasma etching method, which etches a thin film formed on a substrate with plasma, is used when manufacturing various devices, such as LEDs and displays. To fix and position a substrate during etching, for example, a monopolar electrostatic chuck is used to attract the substrate (e.g., refer to patent document 1).

Patent Document 1: Japanese Laid-Open Patent Publication No. 2001-15581

SUMMARY OF THE INVENTION

When a thin film formed on a substrate is etched with plasma, by-products resulting from reactions in the plasma may fall from above the substrate onto the surface of the substrate. Additionally, by-products from prior etchings are deposited on an inner wall of a chamber in which the plasma is generated. Thus, when the temperature of the inner wall of the chamber changes or grains in the plasma strike the deposits, the deposits may be separated from the inner wall. Consequently, the deposits, which are separated from the inner wall of the chamber, and the by-products, which fall from above the substrate, may form particles on the surface of the etched substrate.

Particles are formed on the substrate surface, which is the subject of etching, not only when etching a thin film on the substrate but also when etching the substrate. Additionally, when performing plasma etching, in which etching is performed with plasma, regardless of whether plasma is generated through an induction coupling process, a capacitor coupling process, or a microwave process, particles may also be formed on the surface of a substrate. Further, when processing the substrate through plasma processing other than plasma etching, such as plasma CVD or plasma sputtering, particles may also be formed on the surface of a substrate.

It is an object of the technique of the present disclosure to provide a plasma etching method, a plasma etching device, a plasma processing method, and a plasma processing device that limits the formation of particles on the surface of a substrate.

The means for solving the problem and the operational advantage will now be described.

One aspect of the technique of the present disclosure is a plasma etching method that includes a first step of attracting a substrate onto a monopolar electrostatic chuck in a first plasma, which is a plasma of a noble gas, and stopping generation of the first plasma after the attracting of the substrate, and a second step of etching the substrate in a second plasma, which is a plasma of a halogen-based etching gas, and stopping generation of the second plasma after the etching of the substrate. In the first step, the generation of the first plasma is stopped when a positive voltage is applied from the monopolar electrostatic chuck to the substrate. In the second step, the generation of the second plasma is stopped when a negative voltage is applied from the monopolar electrostatic chuck to the substrate.

One aspect of the technique of the present disclosure is a plasma etching device that includes a chamber, a monopolar electrostatic chuck configured to attract a substrate in the chamber, a first plasma generation unit configured to generate a first plasma, which is a plasma of a noble gas, in the chamber, a second plasma generation unit configured to generate a second plasma, which is a plasma of a halogen-based etching gas, in the chamber, and a controller configured to control driving of the monopolar electrostatic chuck, driving of the first plasma generation unit, and driving of the second plasma generation unit. The controller is configured to drive the monopolar electrostatic chuck in the first plasma to attract the substrate onto the monopolar electrostatic chuck, and after the substrate is attracted, stop plasma generation performed by the first plasma generation unit when a positive voltage is applied from the monopolar electrostatic chuck to the substrate. The controller is further configured to drive the monopolar electrostatic chuck in the second plasma and stop plasma generation performed by the second plasma generation unit when a negative voltage is applied from the monopolar electrostatic chuck to the substrate.

In the aspect of the technique of the present disclosure, generation of the first plasma allows the monopolar electrostatic chuck to attract the substrate. When the generation of the first plasma is stopped, the positive voltage is applied from the monopolar electrostatic chuck to the substrate. On the other hand, when the generation of the second plasma, which is used to etch the substrate, is stopped, the negative voltage, the polarity of which is opposite to that used when processing with the first plasma, is applied to the substrate. Thus, the particles unique to the first plasma and the particles unique to the second plasma are each inhibited from being generated on the surface of the substrate when applying a voltage having a polarity suitable for the corresponding particles. Consequently, in each step of the plasma etching, the generation of the particles unique to the step is limited.

In another aspect of the plasma etching method according to the present disclosure, in the first step, before the generation of the first plasma is stopped, a polarity of a voltage applied from the monopolar electrostatic chuck to the substrate is reversed.

In the aspect of the plasma etching method according to the present disclosure, the polarity of the voltage applied from the monopolar electrostatic chuck to the substrate is reversed while the first plasma is generated. This inhibits electric charges from accumulating on the substrate as compared to a configuration in which the polarity of the voltage applied by the monopolar electrostatic chuck is not reversed.

In a further aspect of the plasma etching method according to the present disclosure, in the second step, before the generation of the second plasma is stopped, a polarity of a voltage applied from the monopolar electrostatic chuck to the substrate is reversed.

In the aspect of the plasma etching method according to the present disclosure, the polarity of the voltage applied from the monopolar electrostatic chuck to the substrate is reversed while the second plasma is generated. This inhibits electric charges from accumulating on the substrate as compared to a configuration in which the polarity of the voltage applied by the monopolar electrostatic chuck is not reversed.

In a further aspect of the plasma etching method according to the present disclosure, in the first step, a polarity of a voltage applied to the substrate is reversed at a constant cycle, and a period in which the first plasma is generated is set as a period that ends when the polarity is positive.

In the aspect of the plasma etching method according to the present disclosure, the setting of a cycle in which the polarity is reversed and the setting of a period in which the first plasma is generated allow the repetition of the polarity reversal and the stopping of the first plasma generation when the positive voltage is being applied.

In a further aspect of the plasma etching method according to the present disclosure, in the second step, a polarity of a voltage applied to the substrate is reversed at a constant cycle, and a period in which the second plasma is generated is set as a period that ends when the polarity is negative.

In the aspect of the plasma etching method according to the present disclosure, the setting of a cycle in which the polarity is reversed and the setting of a period in which the second plasma is generated allow the repetition of the polarity reversal and the stopping of the plasma generation when the positive voltage is being applied.

In a further aspect of the plasma etching method according to the present disclosure, the noble gas is an argon gas, and the etching gas is boron trichloride.

In the aspect of the plasma etching method according to the present disclosure, formation of particles resulting from the generation of the argon gas plasma may be limited. Also, formation of particles resulting from etching using the boron trichloride plasma may be limited.

One aspect of the technique of the present disclosure is a plasma processing method that includes a first step of attracting a substrate onto a monopolar electrostatic chuck in a first plasma, which is a plasma of a noble gas, and stopping generation of the first plasma after the attracting of the substrate, and a second step of processing the substrate in a second plasma, which differs from the first plasma, and stopping generation of the second plasma after the processing of the substrate. In the first step, the generation of the first plasma is stopped when a positive voltage is applied from the monopolar electrostatic chuck to the substrate. In the second step, the generation of the second plasma is stopped when a negative voltage is applied from the monopolar electrostatic chuck to the substrate.

One aspect of the technique of the present disclosure is a plasma processing device that includes a chamber, a monopolar electrostatic chuck that attracts a substrate in the chamber, a first plasma generation unit that generates a first plasma, which is a plasma of a noble gas, in the chamber, a second plasma generation unit that generates a second plasma, which differs from the first plasma, in the chamber, and a controller that controls driving of the monopolar electrostatic chuck, driving of the first plasma generation unit, and driving of the second plasma generation unit. The controller drives the monopolar electrostatic chuck in the first plasma and, after the substrate is attracted to the monopolar electrostatic chuck, stops plasma generation performed by the first plasma generation unit when a positive voltage is applied from the monopolar electrostatic chuck to the substrate. Also, the controller drives the monopolar electrostatic chuck in the second plasma and stops plasma generation performed by the second plasma generation unit when a negative voltage is applied from the monopolar electrostatic chuck to the substrate.

DESCRIPTION OF THE EMBODIMENTS

A plasma processing method and one embodiment of a plasma processing device of the present disclosure will now be described with reference to FIGS. 1 and 2. Here, a plasma etching method and a plasma etching device will be described as an example. However, the technique of the present disclosure is applicable to a method and a device that process a substrate using plasma processing other than plasma etching (e.g., plasma CVD or plasma sputtering).

[Plasma Etching Device]

Figure 1:
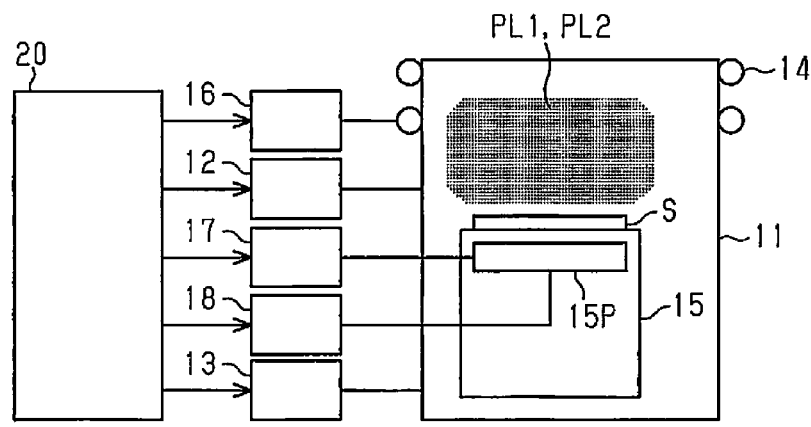
FIG. 1 is a block diagram showing the structure of one embodiment of a plasma etching device according to the technique of the present disclosure.
Figure 2:
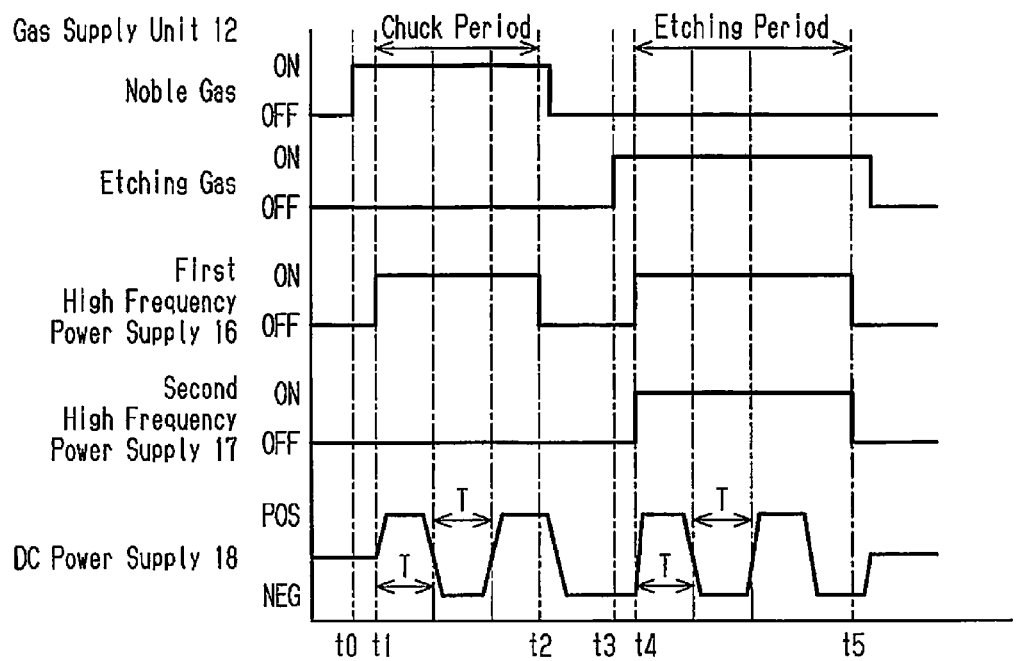
FIG. 2 is a timing chart showing the DC voltage applied to a substrate during a chuck period and an etching period in the embodiment according to the technique of the present disclosure.

As shown in FIG. 1, a plasma etching device includes a chamber 11, a gas supply unit 12, an air discharge unit 13, a plasma generation unit 14, an electrostatic chuck 15, a first high frequency power supply 16, a second high frequency power supply 17, a DC power supply 18, and a controller 20. The plasma generation unit 14 is an example of a first plasma generation unit and a second plasma generation unit. The controller 20 sets a chuck period and an etching period. The chuck period is arranged so that the electrostatic chuck 15 attracts a substrate S. The etching period is arranged so that the substrate S attracted to the electrostatic chuck 15 is etched using a plasma. The controller 20 controls the driving of each of the gas supply unit 12, the air discharge unit 13, the first high frequency power supply 16, the second high frequency power supply 17, and the DC power supply 18 during each of the chuck period and the etching period.

The gas supply unit 12 separately supplies a noble gas and an etching gas into the chamber 11 in accordance with a control signal received from the controller 20. During the chuck period, the controller 20 controls the driving of the gas supply unit 12 so that the flow rate of the noble gas conforms to the processing conditions. During the etching period, the controller 20 controls the driving of the gas supply unit 12 so that the flow rate of the etching gas conforms to the processing conditions. The etching gas is a halogen-based gas including at least one selected from a group consisting of a boron trichloride gas, a hydrogen chloride gas, and a hydrogen bromide gas.

The air discharge unit 13 is connected into the chamber 11 and discharges the air from the chamber 11. During each of the chuck period and the etching period, the controller 20 controls the driving of the air discharge unit 13 so that the internal pressure of the chamber 11 conforms to the processing conditions. The air discharge unit 13 includes, for example, a vacuum pump connected to the chamber 11 and a valve arranged between the chamber 11 and the pump.

The plasma generation unit 14 is located on an upper portion of the chamber 11 and includes an electrode connected to the first high frequency power supply 16. The first high frequency power supply 16 supplies high frequency power to the electrode of the plasma generation unit 14 in accordance with the control signal received from the controller 20. The electrode of the plasma generation unit 14 may be, for example, an induction coil, a plate electrode, or a magnetron electrode. The first high frequency power supply 16 functions as a power supply connected to the plasma generation unit 14 and includes, for example, a high frequency power supply outputting high frequency power at a frequency of 13.56 MHz.

During the chuck period, the controller 20 controls the driving of the first high frequency power supply 16 so that the high frequency power supplied by the first high frequency power supply 16 conforms to the processing conditions. The plasma generation unit 14 generates a first plasma PL1, which is a plasma of a noble gas, in the chamber 11 based on the high frequency power applied to the electrode of the plasma generation unit 14. During the etching period, the controller 20 controls the driving of the first high frequency power supply 16 so that the high frequency power supplied by the first high frequency power supply 16 conforms to the processing conditions. The plasma generation unit 14 generates a second plasma PL2, which is a plasma of an etching gas, in the chamber 11 based on the high frequency power applied to the electrode of the plasma generation unit 14.

The electrostatic chuck 15 is a monopolar electrostatic chuck applying a monopolar DC voltage to a substrate stage, on which the substrate S is placed. The substrate stage incorporates a stage electrode 15P connected to the second high frequency power supply 17 and the DC power supply 18. The second high frequency power supply 17 supplies high frequency power to the stage electrode 15P in accordance with the control signal received from the controller 20. The DC power supply 18 supplies the stage electrode 15P with a positive voltage relative to the ground potential and a negative voltage relative to the ground potential in accordance with the control signal received from the controller 20. For example, the DC power supply 18 alternately applies the positive voltage of 5.0 kV and the negative voltage of −5.0 kV.

During the chuck period, the controller 20 controls the driving of the DC power supply 18 so that the application of the positive voltage and the application of the negative voltage are alternately repeated at constant cycles and the generation of the first plasma PL1 is stopped when the positive voltage is being applied. During the etching period, the controller 20 controls the driving of the DC power supply 18 so that the application of the positive voltage and the application of the negative voltage are alternately repeated at the constant cycles and the generation of the second plasma PL2 is stopped when the negative voltage is being applied. Additionally, during the etching period, the controller 20 controls the driving of the second high frequency power supply 17 so that the high frequency power applied from the second high frequency power supply 17 to the stage electrode 15P conforms to the processing conditions.

The DC voltage applied to the stage electrode 15P functions to attract the substrate S, which is insulative, on the surface of the substrate stage. The polarity reversal of the DC voltage applied to the stage electrode 15P inhibits static electric charges from being excessively deposited on the substrate S. The high frequency power applied to the stage electrode 15P functions to pull etchants from the plasma on the surface of the substrate S.

The electrostatic chuck 15 may supply a helium gas, which functions as a coolant, to a gap between the substrate S placed on the surface of the substrate stage and the surface of the substrate stage. Alternatively, the electrostatic chuck 15 may have a structure in which the substrate S is simply placed on the surface of the substrate stage. Additionally, the substrate stage may further include a clamp used to press the edge of the substrate on the substrate stage so that the substrate S is not separated from the surface of the substrate stage when the polarity of the DC voltage is reversed.

[Plasma Etching Method]

A plasma etching method performed by the plasma etching device will now be described with reference to FIG. 2.

Before starting the plasma etching method, the substrate S, which is the subject of etching, is placed on the substrate stage. For example, a sapphire substrate is one example of an insulative substrate serving as a base material used for manufacturing LEDs. The surface of the substrate S may include, for example, a gallium film or a gallium nitride film, which is processed through etching. Alternatively, the upper surface of the sapphire substrate may be served as the upper surface of the substrate S. When the substrate S is placed on the substrate stage, the controller 20 drives the air discharge unit 13 so that the air is discharged from the chamber 11 until the pressure becomes equal to a predetermined value.

Then, at timing t0, the controller 20 has the gas supply unit 12 supply the noble gas. At timing t1, which is when the chuck period starts, the controller 20 has the first high frequency power supply 16 supply the high frequency power to generate the first plasma PL1. Then, the controller 20 has the DC power supply 18 apply the DC voltage so that the positive voltage (POS) and the negative voltage (NEG) are alternately repeated at constant cycles T. The application of the DC voltage generates an electrostatic force that attracts the substrate S to the surface of the electrostatic chuck 15.

The repetition of the polarity reversal of the DC voltage limits a deposition of static electric charges on the substrate S. Thus, an excessive decrease in the electrostatic force acting on the substrate S may be limited compared to when the application of the DC voltage is started. The maintenance of the electrostatic force in the substrate S stabilizes the position of the substrate S. Additionally, in a structure in which a helium gas is supplied to the gap between the surface of the substrate stage and the substrate S, the maintenance of the electrostatic force in the substrate S limits an excessive leakage of the helium from the gap between the substrate stage and the substrate S.

At timing t2, in which the DC power supply 18 is applying the positive voltage, the controller 20 has the first high frequency power supply 16 stop supplying the high frequency power to the plasma generation unit 14. That is, when the DC power supply 18 is applying the positive voltage, the controller 20 stops the generation of the first plasma PL1. In this manner, the controller 20 ends the chuck period, in which the substrate S is attracted to the surface of the substrate stage.

At timing t3, the controller 20 has the gas supply unit 12 start supplying the etching gas. At timing t4, which is when the etching period starts, the controller 20 has the first high frequency power supply 16 supply the high frequency power so that the second plasma PL2 is generated. The controller 20 also has the second high frequency power supply 17 supply the high frequency power. Then, the controller 20 has the DC power supply 18 apply the DC voltage so that the positive voltage and the negative voltage are alternately repeated at the constant cycles T. The electrostatic force generated by the application of the DC voltage attracts the substrate S on the surface of the electrostatic chuck 15. Additionally, in the same manner as the chuck period, the repetition of the polarity reversal of the DC voltage limits a deposition of static electric charges on the substrate S. Thus, an excessive decrease in the electrostatic force acting on the substrate S may be limited compared to when the application of the DC voltage is started. The supply of the high frequency power to the electrostatic chuck 15 pulls the etchant from the plasma toward the substrate S, which is attracted to the electrostatic chuck 15, and provides anisotropy to the direction in which the etching proceeds in the substrate.

At timing t5, in which the DC power supply 18 is applying the negative voltage, the controller 20 has each of the first high frequency power supply 16 and the second high frequency power supply 17 stop supplying the high frequency power. That is, when the DC power supply 18 is applying the negative voltage, the controller 20 stops the generation of the second plasma PL2. In this manner, the controller 20 ends the etching period, in which the substrate S is etched.

When the substrate S is attracted using the first plasma PL1, by-products generated during prior etchings are deposited on the inner wall of the chamber 11, in which the first plasma PL1 is generated. Thus, when the temperature of the inner wall of the chamber 11 changes or grains in the first plasma PL1 and the deposits collide, the deposits may be separated. Some of the grains having a size that results in the formation of particles are electrically charged in correspondence with the state of the first plasma PL1 and float in the first plasma PL1. When the generation of the first plasma PL1 is stopped, the state of the electric field greatly changes in the surface of the substrate S, which is attracted to the electrostatic chuck 15. Thus, the movement of the grains floating above the substrate S also changes.

When the substrate S is etched using the second plasma PL2, by-products generated resulting from reactions in the second plasma PL2 may fall from above the substrate S on the surface of the substrate S. Also, in this case, some grains having a size that results in the formation of particles are electrically charged in correspondence with the state of the second plasma PL2 and float in the second plasma PL2. When the generation of the second plasma PL2 is stopped, the state of the electric field greatly changes in the surface of the substrate S, which is attracted to the electrostatic chuck 15. Thus, the movement of the grains floating above the substrate S also changes. The floating grains differ from one another in the electric charge applied by the first plasma PL1, which is the noble gas plasma, and the electric charge applied by the second plasma PL2, which is the etching gas plasma.

In this regard, in the above configuration, the generation of the first plasma PL1 is stopped when the electrostatic chuck 15 is applying the positive voltage to the substrate S. In contrast, the generation of the second plasma PL2 is stopped when the negative voltage, the polarity of which is opposite to that used when processing with the first plasma PL1, is applied to the substrate S. Thus, the particles unique to the first plasma PL1 and the particles unique to the second plasma PL2 are repelled from the substrate S when the voltage having the polarity that repels the particles is applied to the substrate S. Consequently, in a first step including the chuck period, in which the substrate S is attracted, and a second step including the etching period, in which the substrate S is etched, the generation of the particles unique to the corresponding step is limited.

EXAMPLES

Figure 3:
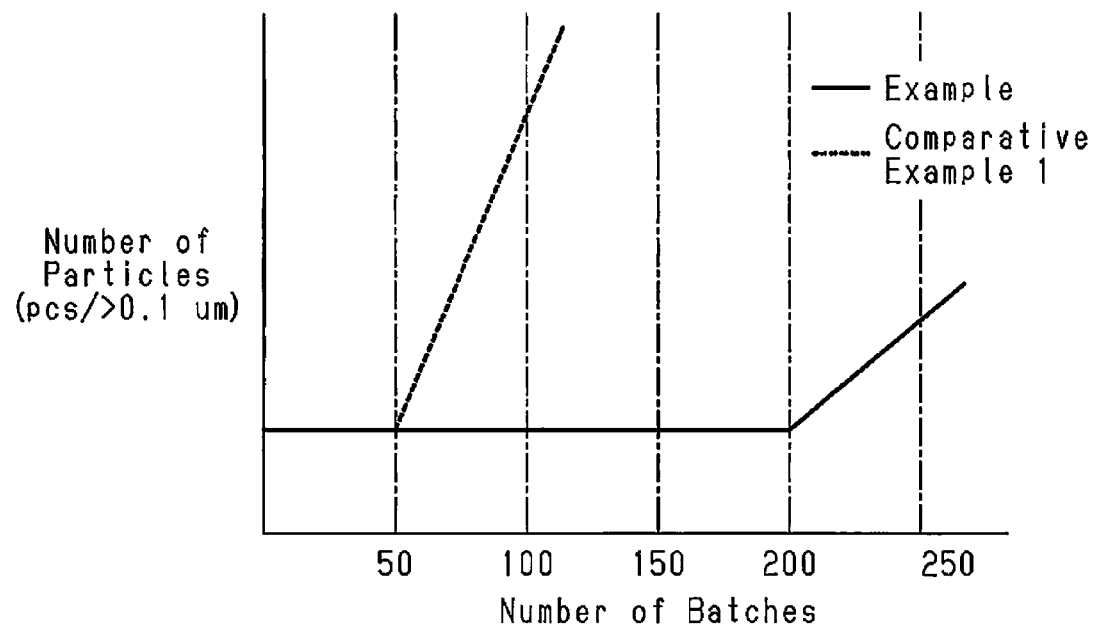
FIG. 3 is a graph showing the number of particles relative to the number of processed batches, the graph including the number of particles in an example in which the generation of a first plasma is stopped when a positive voltage is applied to the substrate, and the number of particles in a comparative example in which the generation of the first plasma is stopped when a negative voltage is applied to the substrate.
Figure 4:
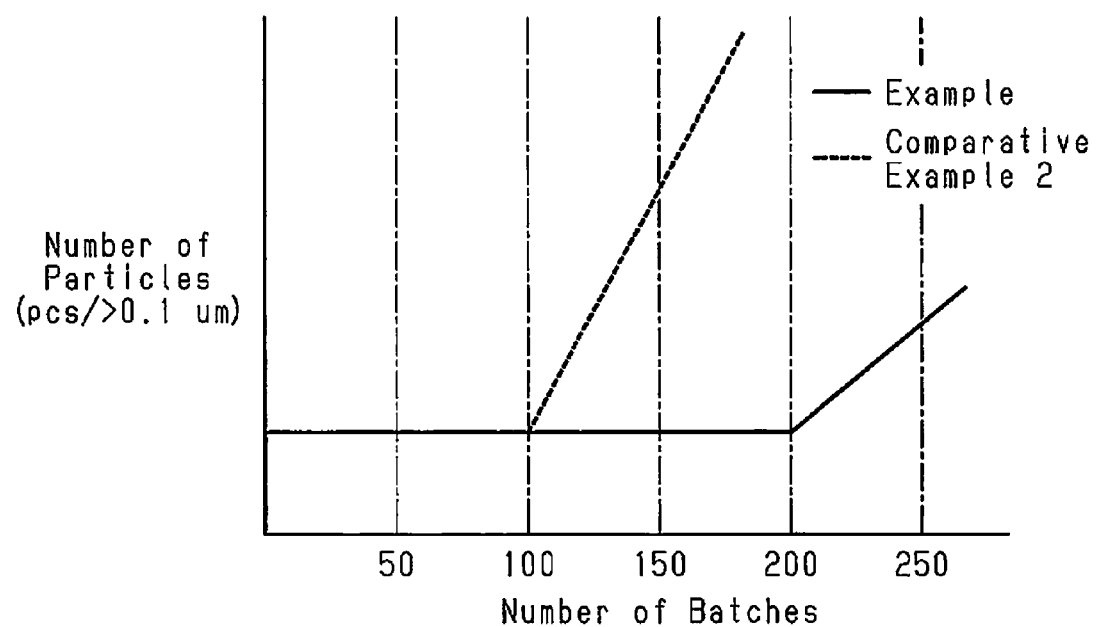
FIG. 4 is a graph showing the number of particles relative to the number of processed batches, the graph including the number of particles in an example in which the generation of a second plasma is stopped when a negative voltage is applied to the substrate, and the number of particles in a comparative example in which the generation of the second plasma is stopped when a positive voltage is applied to the substrate.

The shifting of the number of particles relative to the number of batches processed using the plasma etching device will now be described with reference to FIGS. 3 and 4. FIG. 3 shows the number of particles in an example in which the generation of the first plasma PL1 is stopped when a positive voltage is applied to the substrate S, and the generation of the second plasma PL2 is stopped when a negative voltage is applied to the substrate. FIG. 3 also shows the number of particles in comparative example 1, which differs from the example only in that the generation of the first plasma PL1 is stopped when the negative voltage is applied to the substrate S. FIG. 4 shows the number of particles in the same example as FIG. 3 and the number of particles in comparative example 2, which differs from the example only in that the generation of the second plasma PL2 is stopped when the positive voltage is applied to the substrate S. The processing conditions of the examples and the comparative examples are shown below.

Substrate S: sapphire substrate
Etching Subject: sapphire
Plasma Generation Unit 14: induction coil
First High Frequency Power Supply 16: frequency 13.56 MHz/output 1500 W
Second High Frequency Power Supply 17: frequency 12.5 MHz/output 1500 W
Noble Gas: argon gas/flow rate 100 sccm
Etching Gas: boron trichloride/flow rate 100 sccm
Chuck Period: 190 seconds
Etching Period: 1600 seconds
Polarity Reversal Cycle: 6 seconds
Positive Voltage applied by DC Power Supply 18: 5.0 kV
Negative Voltage applied by DC Power Supply 18: 5.0 kV
Helium Cooling: available As shown in FIG. 3, the number of particles in the example remains at a low level until the number of batches reaches 200. After the number of batches exceeds 200, the number of particles gradually increases. In contrast, the number of particles in comparative example 1 remains at a low level, which is the same as the example, until the number of batches reaches 50. After the number of batches exceeds 50, the number of particles rapidly increases. The number of particles that changes in this manner indicates that the stopping of the generation of the first plasma PL1 when the positive voltage is applied to the substrate S further inhibits the formation of particles on the surface of the substrate S as compared to when stopping the generation of the first plasma PL1 during the application of the negative voltage to the substrate S.

As shown in FIG. 4, the number of particles in comparative example 2 is stable at a low level, which is the same as the example, in a range of the number of batches up to 100 and rapidly increases in a range of the number of batches exceeding 100. The number of particles that change in this manner indicates that the stopping of the generation of the second plasma PL2 when the negative voltage is being applied to the substrate S further inhibits the particles from being generated on the surface of the substrate S as compared to the stopping of the generation of the second plasma PL2 when the positive voltage is being applied to the substrate S.

This indicates that the voltage inhibiting the particles from being generated on the surface of the substrate S is the positive voltage when stopping the generation of the first plasma PL1, and the negative voltage when stopping the generation of the second plasma PL2. Such a tendency, in which the number of the particles is reduced in correspondence with the polarity of the DC voltage, is not limited to the combination of the argon gas plasma and the boron trichloride gas plasma and was also confirmed between the first plasma PL1, which is a noble gas plasma, and the second plasma PL2, which is a halogen-based gas plasma.

As described above, the embodiment has the advantages described below.

(1) The particles unique to the first plasma PL1 and the particles unique to the second plasma PL2 are inhibited from being generated on the surface of the substrate S by applying the voltage having the polarity suitable for the corresponding step (plasma). In particular, particles resulting from the generation of the argon gas plasma and the etching with the boron trichloride plasma are inhibited from being generated.

(2) In the chuck period, the polarity of the voltage applied from the electrostatic chuck 15 to the substrate S is reversed while the first plasma PL1 is generated. This inhibits electric charges from accumulating on the substrate S as compared to a configuration in which the polarity of the voltage is not reversed.

(3) In the same manner, in the etching period, the polarity of the voltage applied from the electrostatic chuck 15 to the substrate S is reversed while the second plasma PL2 is generated. This inhibits electric charges from accumulating in the substrate S as compared to a configuration in which the polarity of the voltage is not reversed.

(4) Referring to (2), the repetition of the polarity reversal and the stopping of the generation of the first plasma PL1 when the positive voltage is being applied are achieved by setting the cycle T and a period in which the first plasma PL1 is generated. Here, the control for generating the first plasma PL1 only in the chuck period is independent from the control for reversing the polarity at the cycle T. This simplifies a configuration to synchronize the application of the positive voltage with the stopping of the generation of the first plasma PL1.

(5) Referring to (3), the repetition of the polarity reversal and the stopping of the generation of the second plasma PL2 when the negative voltage is being applied are achieved by setting the cycle T and a period in which the second plasma PL2 is generated. Here, the control for generating the second plasma PL2 only in the etching period is independent from the control for reversing the polarity at the cycle T. This simplifies a configuration to synchronize the application of the negative voltage with the stopping of the generation of the second plasma PL2.

(6) Even when the length of the chuck period varies in accordance with the cycle T so that the generation of the first plasma PL1 is stopped when the positive voltage is being applied, the length of the cycle T is at most 5% of that of the chuck period and sufficiently small. Also, even when the length of the etching period varies in accordance with the cycle T so that the generation of the second plasma PL2 is stopped when the negative voltage is being applied, the length of the cycle T is at most 0.5% of that of the etching period and sufficiently small. Thus, the processing results after the chuck period do not greatly vary from the processing results after the etching period.

The embodiment may be modified as follows.

A single electrostatic chuck 15 may include a plurality of different stage electrodes 15P. In this case, during the chuck period, the voltage supplied to the stage electrodes 15P and used to attract the substrate S may have the same polarity or different polarities. Also, during the etching period, the voltage supplied to the stage electrodes 15P and used to attract the substrate S may have the same polarity or different polarities. Each stage electrode 15P only needs to be configured so that the generation of the first plasma PL1 is stopped when the positive voltage is being applied from the stage electrode 15P to the substrate S, and the generation of the second plasma PL2 is stopped when the negative voltage is being applied from the stage electrode 15P to the substrate S.

Figure 5:
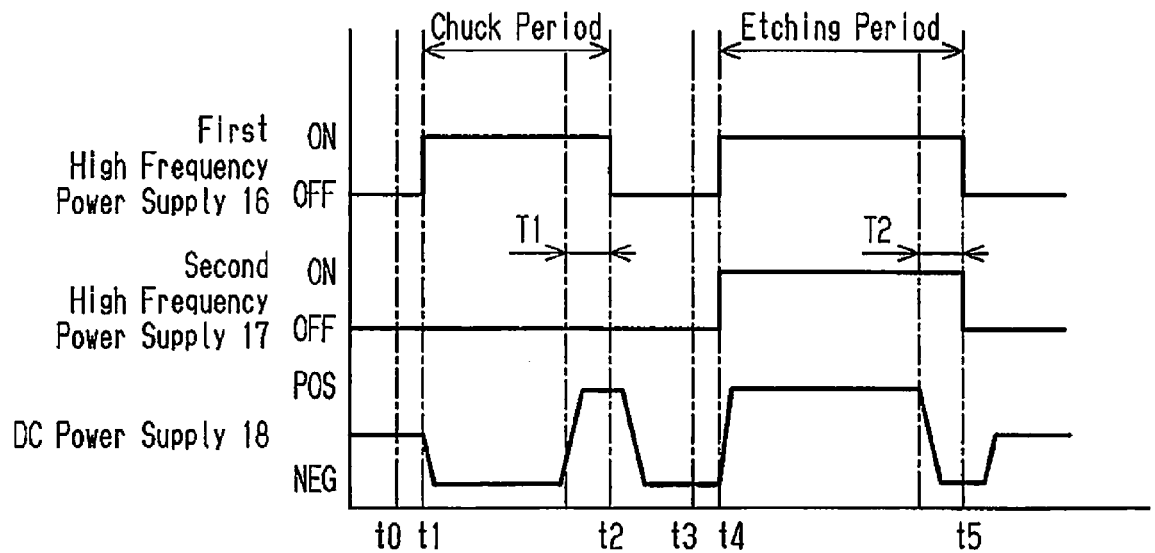
FIG. 5 is a timing chart showing the DC voltage applied to the substrate during a chuck period and an etching period in a modified example.

The voltage used to attract the substrate S may be set based on the elapsed time during which the first plasma PL1 is generated. For example, referring to FIG. 5, the controller 20 may include a function to measure a period in which the first high frequency power supply 16 is being driven as the time elapsed during the generation of the first plasma PL1. When the measured time is shorter than the chuck period just by a time T1, the controller 20 may set the voltage, which is used to attract the substrate S, to the positive voltage. Such a voltage application control also allows the synchronization of the application of the positive voltage by the electrostatic chuck 15 and the stopping of the generation of the first plasma PL1. Thus, the advantages equivalent to (1) to (3) may be obtained.

The voltage used to attract the substrate S may be set based on the elapsed time during which the second plasma PL2 is generated. For example, referring to FIG. 5, the controller 20 may include a function to measure a period in which the first high frequency power supply 16 and the second high frequency power supply 17 are being driven as the time elapsed during the generation of the second plasma PL2. When the measured time is shorter than the etching period just by a time T2, the controller 20 may set the voltage, which is used to attract the substrate S, to the negative voltage. Such a voltage application control also allows the synchronization of the application of the negative voltage by the electrostatic chuck 15 and the stopping of the generation of the second plasma PL2. Thus, the advantages equivalent to (1) to (3) may be obtained.

In the chuck period, the polarity reversal of the voltage used to attract the substrate S may be aperiodic, for example, so that a period in which the positive polarity is maintained differs from a period in which the negative polarity is maintained. Additionally, in the etching period, the polarity reversal of the voltage used to attract the substrate S may be aperiodic.

In the chuck period, the waveform of the voltage used to attract the substrate S is not limited to a square wave resulting from the polarity reversal and may be, for example, a sine wave or a triangular wave. Additionally, in the etching period, the waveform of the voltage used to attract the substrate S is not limited to a square wave resulting from the polarity reversal and may be, for example, a sine wave or a triangular wave.

Figure 6:
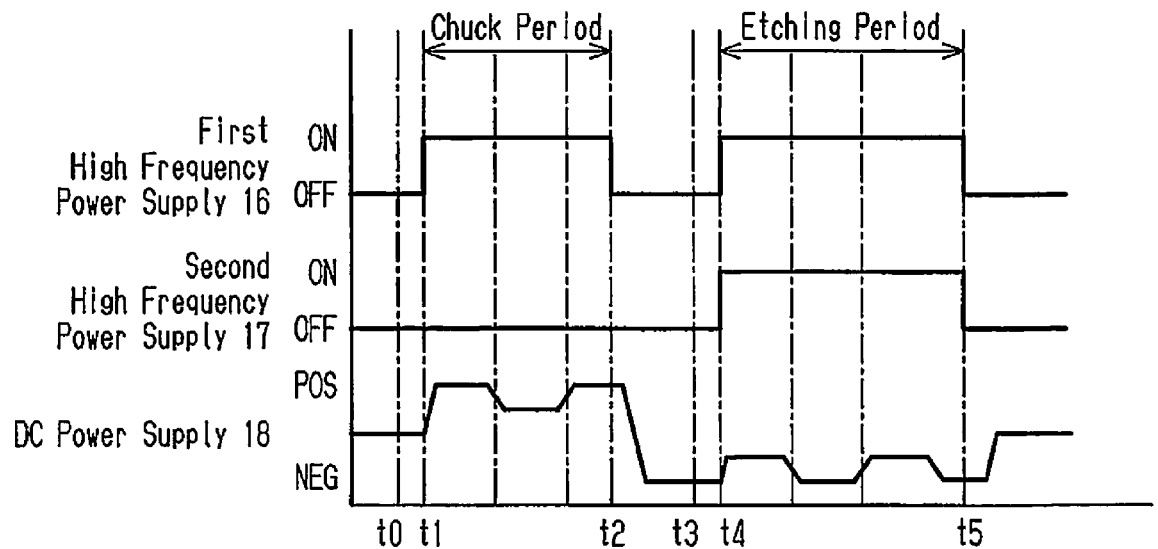
FIG. 6 is a timing chart showing the DC voltage applied to the substrate during a chuck period and an etching period in a modified example.

As shown in FIG. 6, in the chuck period, the voltage used to attract the substrate S may maintain the same polarity and alternately increase and decrease in a repetitive manner. Further, in the chuck period, the voltage used to attract the substrate S may maintain the same polarity and be constant.

In the etching period, the voltage used to attract the substrate S may maintain the same polarity and alternately increase and decrease in a repetitive manner. Further, in the etching period, the voltage used to attract the substrate S may maintain the same polarity and be constant.

The attraction force needed to attract the substrate S on the substrate stage varies in accordance with the material of the substrate S, the size of the substrate S, and whether or not helium for cooling the substrate S exists. Thus, in accordance with these conditions, it is preferred that the voltage used to attract the substrate S to the substrate stage appropriately change the reversal cycle, whether or not reversals are performed, the waveform, and the like.

The configuration only needs to stop generating the first plasma PL1 when the positive voltage is applied from the electrostatic chuck 15 to the substrate S and stop generating the second plasma PL2 when the negative voltage is applied from the electrostatic chuck 15 to the substrate S.

The plasma etching device may be configured to include a magnetic field coil formed along the periphery of the chamber 11 and form a magnetic neutral line, which is used to increase plasma density, in the chamber 11.

The insulative substrate S only needs to have sufficient insulation for generating an attraction force in the electrostatic chuck 15 when the electrostatic chuck 15 is supplied with the voltage. The insulative substrate S may be, for example, a quartz substrate, a glass substrate, a silicon nitride substrate, or the like.

A step other than the first step and the second step may be included between the first step and the second step. For example, when a thin film that is to be etched has a two-layer structure including an upper layer and a lower layer, the lower layer may be etched in the second step. In this case, a step for etching the upper layer may be included between the first step and the second step.

The invention claimed is:

1. A plasma etching method comprising:
   a first step of attracting a substrate onto a monopolar electrostatic chuck in a first plasma, which is a plasma of a noble gas, and stopping generation of the first plasma after the attracting of the substrate; and
   a second step of etching the substrate in a second plasma, which is a plasma of a halogen-based etching gas, and stopping generation of the second plasma after the etching of the substrate, wherein
   in the first step, the generation of the first plasma is stopped when a positive voltage is applied from the monopolar electrostatic chuck to the substrate, and
   in the second step, the generation of the second plasma is stopped when a negative voltage is applied from the monopolar electrostatic chuck to the substrate.

2. The plasma etching method according to claim 1, wherein in the first step, before the generation of the first plasma is stopped, a polarity of a voltage applied from the monopolar electrostatic chuck to the substrate is reversed.

3. The plasma etching method according to claim 1, wherein in the second step, before the generation of the second plasma is stopped, a polarity of a voltage applied from the monopolar electrostatic chuck to the substrate is reversed.

4. The plasma etching method according to claim 1, wherein in the first step,
   a polarity of a voltage applied to the substrate is reversed at a constant cycle, and
   a period in which the first plasma is generated is set as a period that ends when the polarity is positive.

5. The plasma etching method according to claim 1, wherein in the second step,
   a polarity of a voltage applied to the substrate is reversed at a constant cycle, and
   a period in which the second plasma is generated is set as a period that ends when the polarity is negative.

6. The plasma etching method according to claim 1, wherein the noble gas is an argon gas, and the etching gas is boron trichloride.

7. A plasma etching device comprising:
   a chamber;
   a monopolar electrostatic chuck configured to attract a substrate in the chamber;
   a first plasma generation unit configured to generate a first plasma, which is a plasma of a noble gas, in the chamber;
   a second plasma generation unit configured to generate a second plasma, which is a plasma of a halogen-based etching gas, in the chamber; and
   a controller configured to control driving of the monopolar electrostatic chuck, driving of the first plasma generation unit, and driving of the second plasma generation unit, wherein the controller is configured to:
   drive the monopolar electrostatic chuck in the first plasma to attract the substrate onto the monopolar electrostatic chuck, and after the substrate is attracted, stop plasma generation performed by the first plasma generation unit when a positive voltage is applied from the monopolar electrostatic chuck to the substrate; and
   drive the monopolar electrostatic chuck in the second plasma and stop plasma generation performed by the second plasma generation unit when a negative voltage is applied from the monopolar electrostatic chuck to the substrate.

8. A plasma processing method comprising:
   a first step of attracting a substrate onto a monopolar electrostatic chuck in a first plasma, which is a plasma of a noble gas, and stopping generation of the first plasma after the attracting of the substrate; and
   a second step of processing the substrate in a second plasma, which differs from the first plasma, and stopping generation of the second plasma after the processing of the substrate, wherein
   in the first step, the generation of the first plasma is stopped when a positive voltage is applied from the monopolar electrostatic chuck to the substrate, and
   in the second step, the generation of the second plasma is stopped when a negative voltage is applied from the monopolar electrostatic chuck to the substrate.

9. The plasma processing method according to claim 8, wherein in the first step, before the generation of the first plasma is stopped, a polarity of a voltage applied from the monopolar electrostatic chuck to the substrate is reversed.

10. The plasma processing method according to claim 8, wherein in the second step, before the generation of the second plasma is stopped, a polarity of a voltage applied from the monopolar electrostatic chuck to the substrate is reversed.

11. The plasma processing method according to claim 8, wherein in the first step,
- a polarity of a voltage applied to the substrate is reversed at a constant cycle, and
- a period in which the first plasma is generated is set as a period that ends when the polarity is positive.

12. The plasma processing method according to claim 8, wherein in the second step,
- a polarity of a voltage applied to the substrate is reversed at a constant cycle, and
- a period in which the second plasma is generated is set as a period that ends when the polarity is negative.

13. A plasma processing device comprising:

a chamber;

a monopolar electrostatic chuck configured to attract a substrate in the chamber;

a first plasma generation unit configured to generate a first plasma, which is a plasma of a noble gas, in the chamber;

a second plasma generation unit configured to generate a second plasma, which differs from the first plasma, in the chamber; and a controller configured to control driving of the monopolar electrostatic chuck, driving of the first plasma generation unit, and driving of the second plasma generation unit, wherein the controller is configured to:

drive the monopolar electrostatic chuck in the first plasma to attract the substrate onto the monopolar electrostatic chuck, and after the substrate is attracted, stop plasma generation performed by the first plasma generation unit when a positive voltage is applied from the monopolar electrostatic chuck to the substrate; and drive the monopolar electrostatic chuck in the second plasma and stop plasma generation performed by the second plasma generation unit when a negative voltage is applied from the monopolar electrostatic chuck to the substrate.

* * * * *